(12) United States Patent
Utsunomiya

(10) Patent No.: US 7,907,453 B2
(45) Date of Patent: Mar. 15, 2011

(54) NONVOLATILE SEMICONDUCTOR MEMORY DEVICE

(75) Inventor: Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 120 days.

(21) Appl. No.: 12/389,738

(22) Filed: Feb. 20, 2009

(65) Prior Publication Data

US 2009/0213665 A1 Aug. 27, 2009

(30) Foreign Application Priority Data

Feb. 22, 2008 (JP) ............................ JP2008-041145

(51) Int. Cl.
*G11C 16/06* (2006.01)
(52) U.S. Cl. ............. 365/185.21; 365/196; 365/207; 365/189.09; 365/189.07; 365/190
(58) Field of Classification Search ........... 365/185.21, 365/196, 207, 189.09, 189.07, 190
See application file for complete search history.

(56) References Cited

U.S. PATENT DOCUMENTS

| | | | | |
|---|---|---|---|---|
| 4,281,400 A | * | 7/1981 | Schanzer et al. | 365/203 |
| 4,460,985 A | * | 7/1984 | Hoffman | 365/207 |
| 4,970,691 A | * | 11/1990 | Atsumi et al. | 365/189.11 |
| 5,267,203 A | * | 11/1993 | Hwang et al. | 365/190 |
| 5,572,474 A | * | 11/1996 | Sheen et al. | 365/207 |
| 6,084,438 A | | 7/2000 | Hashiguchi | |
| 6,233,189 B1 | * | 5/2001 | Tanzawa et al. | 365/207 |
| 6,426,905 B1 | * | 7/2002 | Dennard et al. | 365/204 |
| 6,438,038 B2 | * | 8/2002 | Ikehashi et al. | 365/185.24 |
| 6,625,057 B2 | * | 9/2003 | Iwata | 365/158 |
| 6,734,719 B2 | * | 5/2004 | Tanzawa et al. | 327/541 |
| 6,836,443 B2 | * | 12/2004 | Dadashev | 365/189.07 |
| 7,548,467 B2 | * | 6/2009 | Kim et al. | 365/189.09 |
| 7,570,524 B2 | * | 8/2009 | Bedeschi et al. | 365/189.06 |
| 2001/0024381 A1 | | 9/2001 | Fuchigami et al. | |

FOREIGN PATENT DOCUMENTS

| | | |
|---|---|---|
| EP | 1610335 A2 | 12/2005 |
| JP | 5-36288 A | 2/1993 |
| JP | 2001-250391 A | 9/2001 |
| WO | WO 2006/105363 A1 | 10/2006 |

OTHER PUBLICATIONS

European Search Report for European Application No. 09153362.0, dated May 28, 2009, 6 pages.

* cited by examiner

*Primary Examiner* — Viet Q Nguyen
(74) *Attorney, Agent, or Firm* — Brinks Hofer Gilson & Lione

(57) ABSTRACT

Provided is a nonvolatile semiconductor memory device which reads out a memory cell at high speed. A minute current source (105) is connected to a clamp NMOS transistor (103) for clamping a drain voltage of a memory cell (101), and a minute current is caused to flow through the clamp NMOS transistor (103). When the current does not flow through the memory cell (101), by causing the minute current to flow through the clamp NMOS transistor (103), the drain voltage of the memory cell (101) is prevented from rising. A bias voltage (BIAS) to be input to the clamp NMOS transistor (103) can be set high and the drain voltage of the memory cell (101) can also be high, and hence a current value of the memory cell (101) becomes larger and speed of sensing a current of a sense amplifier circuit (104) is improved.

16 Claims, 2 Drawing Sheets

NONVOLATILE SEMICONDUCTOR MEMORY DEVICE

RELATED APPLICATIONS

This application claims priority under 35 U.S.C. §119 to Japanese Patent Application No. JP2008-041145 filed on Feb. 22, 2008, the entire content of which is hereby incorporated by reference.

BACKGROUND OF THE INVENTION

1. Field of the Invention

The present invention relates to a nonvolatile semiconductor memory device, and more particularly, to a nonvolatile semiconductor memory device having a clamping circuit for making a drain voltage of a memory cell a desired voltage or lower when the memory cell is read out.

2. Description of the Related Art

In a nonvolatile semiconductor memory device, when a drain voltage of a memory cell is high when the memory cell is read out, a threshold value of the memory cell fluctuates, which is a cause of a data read error. Therefore, it is necessary that the drain voltage of the memory cell in readout be clamped to a voltage or lower at which the threshold voltage of the memory cell does not fluctuate.

FIG. 3 is a circuit diagram of a readout circuit of a conventional nonvolatile semiconductor memory device. The readout circuit illustrated in FIG. 3 includes a memory cell 101, a selection NMOS transistor 102, a clamp NMOS transistor 103, an NMOS transistor 301 forming an inverting amplifier, a constant current source 302, and a sense amplifier circuit 104.

A source of the memory cell 101 is connected to a ground terminal, a drain of the memory cell 101 is connected to a source of the selection NMOS transistor 102, and a gate of the memory cell 101 is connected to a CGBIAS terminal for inputting readout gate potential. A drain of the selection NMOS transistor 102 is connected to a source of the clamp NMOS transistor 103 and to a gate of the NMOS transistor 301, and a selection signal SG for selecting a memory cell to be read out is input to a gate of the selection NMOS transistor 102. The clamp NMOS transistor 103 is provided between the sense amplifier circuit 104 and the selection NMOS transistor 102, and a gate of the clamp NMOS transistor 103 is connected to a drain of the NMOS transistor 301. In the inverting amplifier, the constant current source 302 and the NMOS transistor 301 are connected in series between a power source terminal and a ground terminal. An input terminal of the sense amplifier circuit 104 is connected to a drain of the clamp NMOS transistor 103 (see Japanese Patent Application Laid-open No. 2001-250391, for example).

In the readout circuit as described above, the drain of the selection NMOS transistor 102 is clamped to a threshold voltage of the NMOS transistor 301, and hence, when the selection NMOS transistor 102 is turned ON, the drain voltage of the memory cell 101 is also clamped to the threshold voltage of the NMOS transistor 301. Further, by controlling the gate voltage of the clamp NMOS transistor 103 by the inverting amplifier, the source voltage of the clamp NMOS transistor 103 is controlled to be the above-mentioned voltage, and thus, the clamp voltage does not fluctuate depending on the amount of a current flowing through the memory cell 101.

FIG. 4 is a circuit diagram of a readout circuit of another conventional nonvolatile semiconductor memory device. In the readout circuit illustrated in FIG. 4, instead of the inverting amplifier illustrated in FIG. 3, a bias voltage BIAS is input to the gate of the clamp NMOS transistor 103 so as to obtain a desired clamp voltage (see Japanese Patent Application Laid-open No. Hei 05-36288).

In the readout circuit as described above, the drain voltage of the memory cell is clamped to substantially a voltage which is the bias voltage BIAS minus the threshold value of the clamp NMOS transistor 103.

However, in the conventional nonvolatile semiconductor memory device illustrated in FIG. 3, the inverting amplifier is used to control the clamp voltage as described above, and hence it takes time from when the selection NMOS transistor 102 is turned ON to when the clamp voltage is controlled to be the true clamp voltage. More specifically, it takes time from when the readout is started to when the drain voltage of the memory cell 101 becomes the true value, and thus, it takes time before the current flowing through the memory cell 101 to be read out becomes the true value. As a result, it takes time when the readout is started to when the true result of determination is output from the sense amplifier circuit.

Further, the conventional nonvolatile semiconductor memory device illustrated in FIG. 4 has a problem that the clamp voltage varies depending on the amount of a current flowing through the memory cell to be read out. For example, when a current flows through the memory cell, if the bias voltage BIAS is 1.2 V and the threshold value of the clamp NMOS transistor 103 is 0.5 V, the clamp voltage is 0.7 V. On the other hand, when a current does not flow through the memory cell and the conditions are the same as the above-mentioned conditions, the clamp voltage becomes as high as about 1.2 V, and the threshold value of the memory cell to be read out fluctuates. Therefore, even when a current does not flow through the memory cell, in order to attain the clamp voltage of 0.7 V, it is necessary to lower the bias voltage BIAS to about 0.7 V, and it follows that the clamp voltage when a current flows through the memory cell is 0.2 V, which is very low. As a result, the drain voltage of the memory cell through which a current flows is as low as 0.2 V and the value of a current flowing through the memory cell becomes small. Therefore, the speed of determination by the sense amplifier circuit for sensing the current flowing through the memory cell is lowered.

As described above, the conventional nonvolatile semiconductor memory devices illustrated in FIGS. 3 and 4 have a problem that it takes time from when the readout is started to when the sense amplifier circuit determines the current value of the memory cell.

SUMMARY OF THE INVENTION

The present invention has been made to solve the above-mentioned problem, and an object of the present invention is to provide a nonvolatile semiconductor memory device which carries out readout at high speed without deteriorating the accuracy of the readout.

In order to solve the conventional problem, a nonvolatile semiconductor memory device according to the present invention is configured as follows.

There is provided a nonvolatile semiconductor memory device including: an NMOS transistor in which, in a current path extending from a memory cell to a sense amplifier circuit, a predetermined bias voltage is input to a gate thereof, a current flowing through the memory cell flows from a drain to a source thereof, and a drain voltage of the memory cell is clamped by clamping a source voltage of the NMOS transistor to a predetermined voltage; and a minute current source for causing a minute current to flow from the source of the NMOS transistor to a ground terminal, in which the minute current source prevents the drain voltage of the memory cell from rising when the memory cell having no current flowing therethrough is read out.

According to the nonvolatile semiconductor memory device of the present invention, there can be realized a clamping circuit which clamps in readout the drain voltage of a memory cell to be read out, in which the clamp voltage thereof hardly fluctuates by fluctuations of the current flowing through the memory cell even when an inverting amplifier is not used. Therefore, the drain voltage of the memory cell when a current flows through the memory cell can be set high and the current value of the memory cell can be prevented from being decreased, and thus, compared with a readout circuit in a conventional nonvolatile semiconductor memory device, a period of time from when the readout is started to when a sense amplifier circuit determines the current value of the memory cell can be shortened. In other words, a nonvolatile semiconductor memory device which carries out readout at high speed without deteriorating the accuracy of the readout can be realized.

DETAILED DESCRIPTION OF THE INVENTION

Figure 1:
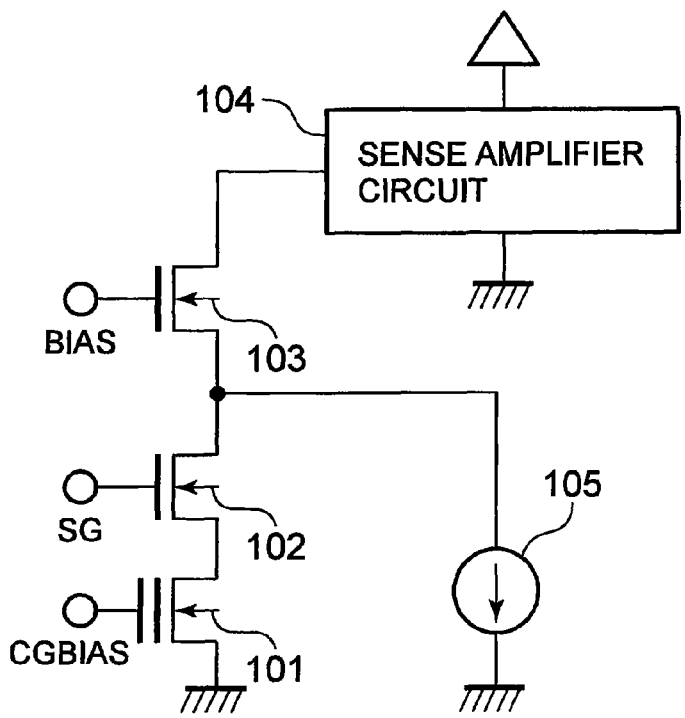
FIG. 1 is a circuit diagram of a readout circuit of a nonvolatile semiconductor memory device according to an embodiment of the present invention.

FIG. 1 is a circuit diagram of a readout circuit of a nonvolatile semiconductor memory device according to an embodiment of the present invention.

The readout circuit according to the embodiment illustrated in FIG. 1 includes a memory cell 101, a selection NMOS transistor 102, a clamp NMOS transistor 103, a sense amplifier circuit 104, and a minute current source 105.

A source of the memory cell 101 is connected to a ground terminal, and a gate of the memory cell 101 is connected to a CGBIAS terminal for inputting readout gate potential. A source of the selection NMOS transistor 102 is connected to a drain of the memory cell 101 and a gate of the selection NMOS transistor 102 is connected to an SG terminal for inputting a selection signal SG for selecting a memory cell to be read out. A source of the clamp NMOS transistor 103 is connected to a drain of the selection NMOS transistor 102 and a gate of the clamp NMOS transistor 103 is connected to a BIAS terminal for inputting a bias voltage BIAS. An input terminal of the sense amplifier circuit 104 is connected to a drain of the clamp NMOS transistor 103. A sync terminal of the minute current source 105 is connected to the source of the clamp NMOS transistor 103 and a source terminal of the minute current source 105 is connected to a ground terminal.

In the readout circuit configured as described above, the sense amplifier circuit 104 senses whether or not a predetermined amount or larger of a current flows through the memory cell 101. The drain of the selection NMOS transistor 102 is clamped to a voltage which is the bias voltage BIAS minus the threshold value of the clamp NMOS transistor 103. Therefore, when the selection NMOS transistor 102 is turned ON, the drain voltage of the memory cell 101 is also clamped to the threshold voltage of the clamp NMOS transistor 103. The minute current source 105 prevents the clamp voltage from rising to the bias voltage BIAS by causing a minute current to flow through the clamp NMOS transistor 103 when a current does not flow through the memory cell 101.

It is to be noted that the current value of the minute current source 105 is set to be small enough for the sense amplifier circuit 104 not to carry out erroneous determination. For example, suppose the sense amplifier circuit 104 is required to distinguish a memory cell current of 10 µA from a memory cell current of 0 µA. In this case, the reference current of the sense amplifier circuit 104 is set to be about 5 µA. It follows that, if the current value of the minute current source 105 is set to be 1 µA or lower, the sense amplifier circuit 104 does not carry out erroneous determination.

Further, in a conventional readout circuit in which the bias voltage BIAS is input to the gate of the clamp NMOS transistor 103, when a current does not flow through the memory cell 101, the clamp voltage becomes as high as the bias voltage BIAS. Therefore, the conventional readout circuit is designed such that the bias voltage BIAS is lowered by a rising amount of the clamp voltage and the clamp voltage becomes the highest possible value at which, when a current does not flow through the memory cell 101, the threshold value of the memory cell 101 does not fluctuate. Therefore, when a current flows through the memory cell 101, the drain voltage of the memory cell 101 drops to decrease the current value of the memory cell 101.

However, in the readout circuit according to the embodiment described above, the minute current source 105 causes a minute current to flow instead of the memory cell, and hence the clamp voltage hardly rises. More specifically, the clamp voltage can be set to be the highest possible value at which, when a current does not flow through the memory cell 101, the threshold value of the memory cell 101 does not fluctuate. As a result, the current value when a current flows through the memory cell 101 is not decreased, and thus, lowering of the speed of determination by the sense amplifier circuit 104 due to the decrease in the current value of the memory cell 101 is not caused.

Therefore, in the readout circuit according to the above-mentioned embodiment, a conventionally used inverting amplifier is not required and the current value of the memory cell is not decreased, and hence readout at higher speed than that in the case of the conventional nonvolatile semiconductor memory device is possible.

Figure 2:
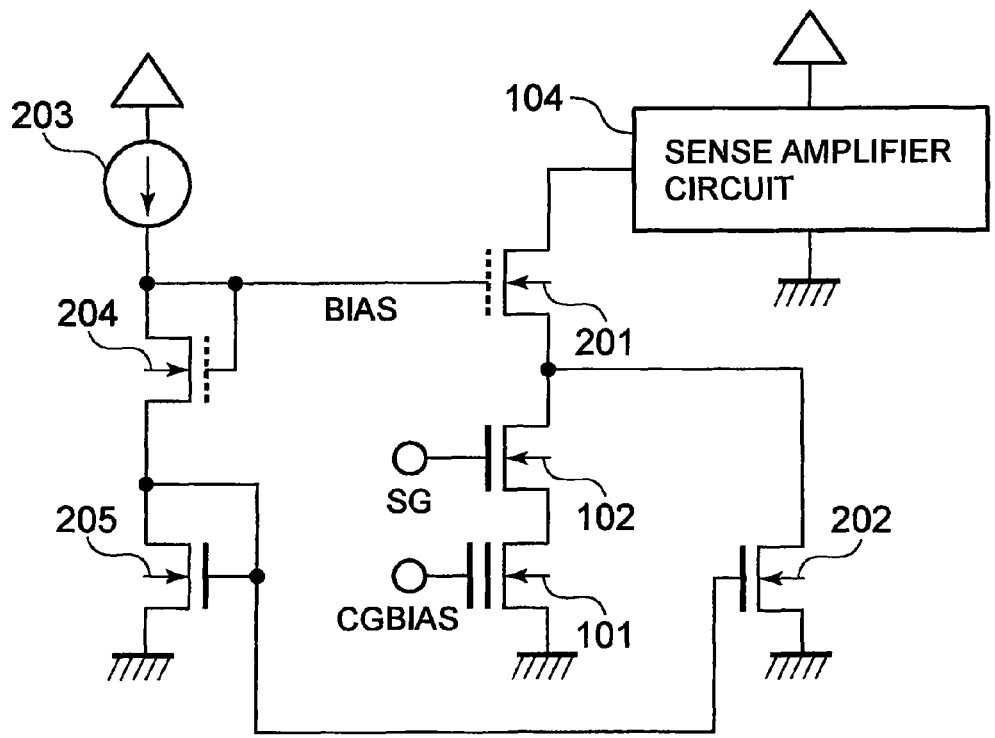
FIG. 2 is a circuit diagram of a specific example of the readout circuit of the nonvolatile semiconductor memory device according to the embodiment of the present invention.
Figure 3:
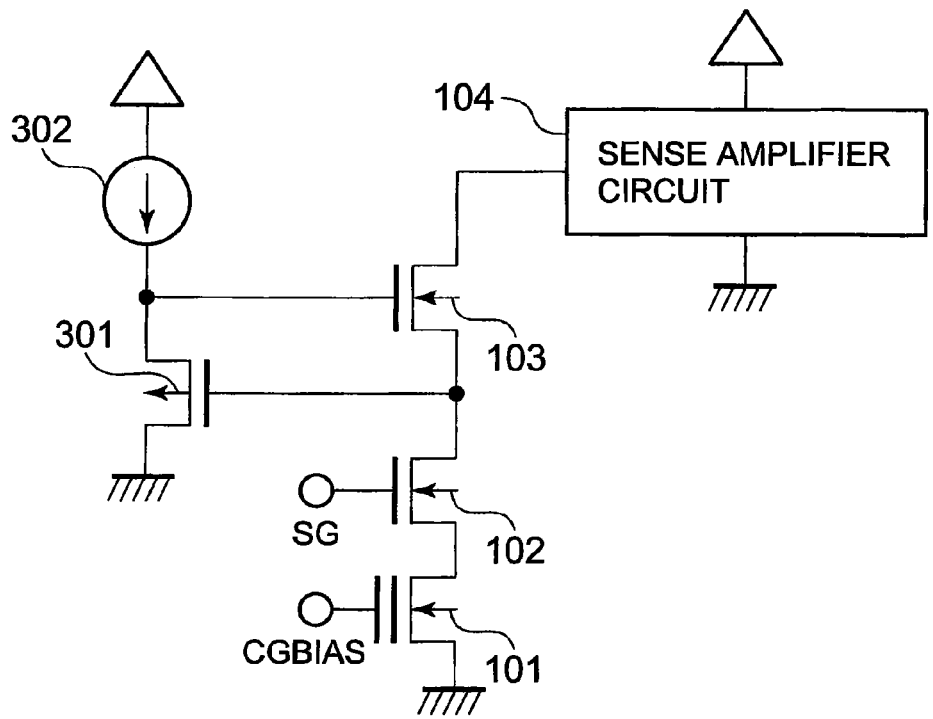
FIG. 3 is a circuit diagram of a readout circuit of a conventional nonvolatile semiconductor memory device.
Figure 4:
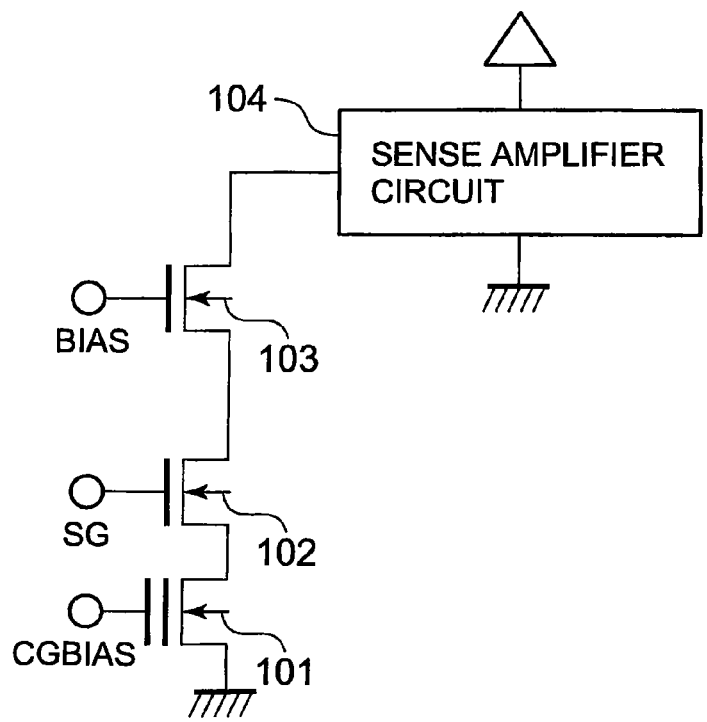
FIG. 4 is a circuit diagram of a readout circuit of another conventional nonvolatile semiconductor memory device.

FIG. 2 is a circuit diagram of a specific example of the readout circuit of the nonvolatile semiconductor memory device according to the embodiment of the present invention, and illustrates a specific exemplary circuit of a circuit for generating the bias voltage BIAS and the minute current source 105 of the circuit diagram in FIG. 1.

The readout circuit according to the embodiment illustrated in FIG. 2 includes the memory cell 101, the selection NMOS transistor 102, a clamp NMOS transistor 201 having the threshold value lower than that of the selection NMOS transistor 102, a constant current source 203, an NMOS transistor 204 having the threshold voltage equal to that of the clamp NMOS transistor 201, an NMOS transistor 205, an NMOS transistor 202, and the sense amplifier circuit 104.

The constant current source 203, the NMOS transistor 204, and the NMOS transistor 205 which are connected in series generate the bias voltage BIAS to be input to a gate of the clamp NMOS transistor 201. A source terminal of the constant current source 203 is connected to a drain and a gate of the NMOS transistor 204. A source of the NMOS transistor 204 is connected to a drain and a gate of the NMOS transistor 205. The drain of the NMOS transistor 204 is connected to the gate of the clamp NMOS transistor 201.

The NMOS transistor 202 having a gate connected to the drain and the gate of the NMOS transistor 205 functions as the minute current source 105 illustrated in FIG. 1.

Except for the portion described above, the circuit is configured in the same way as the readout circuit of the nonvolatile semiconductor memory device according to the embodiment of the present invention illustrated in FIG. 1.

By configuring the readout circuit of the nonvolatile semiconductor memory device as described above, the readout circuit operates as follows and carries out readout at high speed without deteriorating the accuracy of the readout.

A current from the constant current source 203 generates at the drain of the NMOS transistor 204 the bias voltage BIAS which is the threshold value of the NMOS transistor 204 plus the threshold value of the NMOS transistor 205. The bias voltage BIAS is input to the gate of the clamp NMOS transistor 201, and hence the drain of the selection NMOS transistor 102 is clamped to the threshold voltage of the NMOS transistor 205. When the selection NMOS transistor 102 is turned ON, the drain of the memory cell 101 is clamped to the threshold voltage of the NMOS transistor 205.

For example, when the current value of the constant current source 203 is designed to be about 1 µA and the current mirror ratio of the NMOS transistor 205 to the NMOS transistor 202 is designed to be 5:1, a minute current which flows through the NMOS transistor 202 is 0.2 µA, which is so small that the minute current hardly affects the determination by the sense amplifier circuit 104. Further, it goes without saying that, because of the mirror ratio of the current mirror circuit formed of the MOS transistors described above, the method of generating the minute current described above can make smaller the area of the circuit compared with a method of generating a minute current by a resistance element or the like.

Further, the threshold value of the NMOS transistor 204 and the threshold value of the clamp NMOS transistor 201 are the same, and are designed to be lower than the threshold values of other NMOS transistors. This prevents the bias voltage BIAS from easily dropping even when the power supply voltage drops, and the drain voltage of the memory cell 101 does not drop until the power supply voltage becomes considerably low. Therefore, the current value of the memory cell 101 is not decreased until the power supply voltage becomes considerably low, and thus, the speed of the readout of the memory cell is not lowered even when the power supply voltage is low.

It is to be noted that, while, in the embodiment of the present invention, a case in which the minute current source is formed of an NMOS transistor is described, the minute current source may be formed of any element which can cause a current that does not affect the determination by the sense amplifier circuit to flow. It goes without saying that the minute current source may be formed of, for example, a resistance element, a bipolar transistor, a PN diode, or the like.

The invention claimed is:

1. A semiconductor memory device, comprising:
   a memory cell;
   a clamp NMOS transistor connected between the memory cell and an input of a sense amplifier circuit; and
   a minute current source connected to a source of the clamp NMOS transistor and configured to cause a minute current flow from the source of the clamp NMOS transistor to a ground terminal, the minute current source comprising an NMOS transistor that comprises a drain connected to the source of the clamp NMOS transistor.

2. The semiconductor memory device of claim 1, further comprising a selection NMOS transistor connected between the clamp NMOS transistor and the memory cell.

3. A semiconductor memory device, comprising:
   a memory cell;
   a clamp NMOS transistor connected between the memory cell and an input of a sense amplifier circuit; and
   a minute current source connected to a source of the clamp NMOS transistor and configured to cause a minute current flow from the source of the clamp NMOS transistor to a ground terminal, the minute current source comprising one of a resistance element, a bipolar transistor, and a PN diode.

4. The semiconductor memory device of claim 3, further comprising a bias voltage generating circuit configured to provide a bias voltage to a gate of the clamp NMOS transistor.

5. The semiconductor memory device of claim 3, the bias voltage circuit comprising:
   a constant current source comprising a source terminal connected to the gate of the clamp transistor;
   a first NMOS transistor comprising a drain and a gate connected to the gate of the clamp NMOS transistor; and
   a second NMOS transistor comprising:
      a drain and a gate connected a source of the first NMOS transistor and to the minute current source; and
      a source connected to the ground terminal.

6. The semiconductor memory device of claim 3, where the minute current source comprises an NMOS transistor comprising:
   a drain connected to the source of the clamp NMOS transistor; and
   a gate connected to the drain and gate of the second NMOS transistor and to the source of the first NMOS transistor.

7. The semiconductor memory device of claim 5, where the first NMOS transistor and the clamp NMOS transistor each comprising threshold values that are substantially the same.

8. The semiconductor memory device of claim 6, where the threshold value of each of the first NMOS transistor and the clamp NMOS transistor are lower than a threshold value of the second NMOS transistor and a threshold value of the memory cell.

9. A semiconductor memory device, comprising:
   a memory cell;
   a clamp NMOS transistor connected between the memory cell and an input of a sense amplifier circuit; and
   a minute current source connected to a source of the clamp NMOS transistor and configured to cause a minute current flow from the source of the clamp NMOS transistor to a ground terminal;
   where the clamp NMOS transistor comprises a threshold value that is lower than a threshold value of the memory cell.

10. The semiconductor memory device of claim 1, where the minute current source comprises a current value that is less than a reference current of the sense amplifier circuit connected to the clamp NMOS transistor.

11. A semiconductor memory device, comprising:
   a memory cell;
   a clamp NMOS transistor connected between the memory cell and a sense amplifier circuit, the clamp NMOS transistor comprising:
      a gate connected to a bias voltage generating circuit that provides a bias voltage to the gate of the clamp NMOS transistor; and
      a source; and a minute current source connected to the source of the clamp NMOS transistor and configured to cause a minute current flow from the source of the clamp NMOS transistor to a ground terminal such that a drain voltage of the memory cell is prevented from rising when the memory cell is read out while having no current flowing therethrough.

12. The semiconductor memory device of claim 11, further comprising a selection NMOS transistor connected between the clamp NMOS transistor and the memory cell.

13. The semiconductor memory device of claim 11, the minute current source comprising an NMOS transistor that comprises:

a drain connected to the source of the clamp NMOS transistor; and a source connected to the ground terminal.

14. The semiconductor memory device of claim 11, where the clamp NMOS transistor comprises a threshold value that is lower than a threshold value of the memory cell.

15. The semiconductor memory device of claim 11, where the minute current source comprises a current value that is less than a reference current of the sense amplifier circuit connected to the clamp NMOS transistor.

16. The semiconductor memory device of claim 11, the minute current source comprising one of a resistance element, a bipolar transistor, and a PN diode.

* * * * *